(12) United States Patent
Kim et al.

(10) Patent No.: US 6,811,028 B2
(45) Date of Patent: Nov. 2, 2004

(54) PACKING APPARATUS FOR PLASMA DISPLAY PANEL MODULE

(75) Inventors: Ki-jung Kim, Asan (KR); Eui-seon Jeong, Suwon (KR); Guy-sung Kim, Suwon (KR); Dong-an Kim, Ulsan (KR); Je-hee Mun, Cheonan (KR); Yeung-ki Kim, Cheonan (KR)

(73) Assignee: Samsung SDI Co., Ltd., Kyungki-do (KR)

( * ) Notice: Subject to any disclaimer, the term of this patent is extended or adjusted under 35 U.S.C. 154(b) by 9 days.

(21) Appl. No.: 10/054,920

(22) Filed: Jan. 25, 2002

(65) Prior Publication Data

US 2002/0149319 A1 Oct. 17, 2002

(30) Foreign Application Priority Data

Apr. 16, 2001 (KR) ........................................ 2001-20173
Jul. 21, 2001 (KR) ........................................ 2001-44060

(51) Int. Cl.⁷ .......................... B65D 81/02; B65D 85/30; B65D 85/48
(52) U.S. Cl. ........................ 206/587; 206/586; 206/523; 206/453; 206/454
(58) Field of Search ................................ 206/586, 587, 206/592, 523, 320, 449, 453–455, 706–708, 724; 211/41.13, 41.17, 41.18

(56) References Cited

U.S. PATENT DOCUMENTS

| | | | | |
|---|---|---|---|---|
| 4,478,331 A | * | 10/1984 | Ruin | 206/454 |
| 4,815,601 A | * | 3/1989 | Peterson et al. | 206/454 |
| 5,423,422 A | * | 6/1995 | Boire et al. | 206/454 |
| 5,509,534 A | * | 4/1996 | Taravella et al. | 206/587 |
| 5,904,251 A | * | 5/1999 | Ogata et al. | 206/587 |
| 5,950,836 A | * | 9/1999 | Iwamoto et al. | 206/586 |
| 6,145,663 A | * | 11/2000 | Kim et al. | 206/592 |

FOREIGN PATENT DOCUMENTS

| | | |
|---|---|---|
| JP | 9-309570 | 12/1997 |
| JP | 10-13768 | 1/1998 |
| JP | 2001-2065 | 1/2001 |

* cited by examiner

Primary Examiner—Mickey Yu
Assistant Examiner—J. Gregory Pickett
(74) Attorney, Agent, or Firm—Leydig, Voit & Mayer, Ltd.

(57) ABSTRACT

A PDP module packing apparatus includes PDP module packing units, each unit including a support member and a coupling unit for coupling a PDP module to a respective support member for supporting and preventing deformation of the PDP module; and shock absorbing units for receiving and supporting several PDP module packing units, a respective shock absorbing unit being locatable at each of upper and lower ends of the PDP module packing units and receiving one of the upper and lower ends for maintaining spacing between PDP module packing units, and absorbing mechanical shock. Thus, PDP modules can be safely shipped to a destination without receiving external vibration and shock in the PDP module packing apparatus.

10 Claims, 6 Drawing Sheets

PACKING APPARATUS FOR PLASMA DISPLAY PANEL MODULE

BACKGROUND OF THE INVENTION

1. Field of the Invention

The present invention relates to a packing apparatus for packing and shipping plasma display panel (PDP) modules and to packed PDP modules in the PDP module packing apparatus.

2. Description of the Related Art

A typical plasma display panel displays an image by utilizing a gas discharge phenomenon and exhibits superior display characteristics, such as brightness, contrast, afterimage, and viewing angle. Also, since the PDP can be thin and have a large area screen, it is expected to replace the cathode ray tube.

PDPs are generally manufactured through the following steps. First, electrodes, partition walls, and fluorescent substances are formed on glass substrates by screen printing. The glass substrates are sealed and evacuated and filled with a discharge gas as a PDP panel. A chassis, including a circuit board and a power supply, are assembled with the PDP panel as a PDP module. The PDP module, when partially finished, is shipped to a company where the PDP module is integrated into a PDP television set. The complete PDP television sets are delivered to customers.

However, since the PDP is thin and has a large screen, there is a possibility of damage by tiny vibrations and shock during shipping. Electrodes and partition walls may be damaged, or intrusion of foreign matter into a circuit portion may occur. Thus, to safely ship the PDP to a remote place, an appropriate packing apparatus is needed.

Japanese Patent Publication No. Hei. 9-309570 discloses a large PDP entitled "Large PDP Packing Apparatus". The large packing apparatus is used to package a large PDP. In this packing apparatus, a lower pad buffers shock applied to a PDP. A lower end of the PDP is inserted in the lower pad. The front or rear side of the lower pad can be separate. Also, the lower pad is inserted in a box supporting and fixing in place the inserted lower pad. The front or rear side of the box can be open. Thus, with no need to raise the PDP high, the PDP can be easily inserted in the lower pad so that the PDP inserted in the lower pad can be accommodated in the box.

Japanese Patent Publication No. Hei. 10-013768 discloses a PDP cover. The PDP cover includes a box-type container of which one side is open and a rib is present as well as a flexible mat. The PDP cover is installed on the front surface of the PDP so that, when an external force is applied to the PDP during shipping, damage to the PDP is prevented. A similar technology is disclosed in Japanese Patent Publication No. 2001-2065.

However, the disclosed technologies are suitable for packing PDP television sets, not for packing PDP modules in a partially finished state.

SUMMARY OF THE INVENTION

To solve the above-described problems, it is an object of the present invention to provide a packing apparatus for a PDP module in which a PDP module is coupled to a support member and the PDP module coupled to the support member is accommodated in a box together with a shock absorbing unit, so that the PDP module can be protected from external vibration and shock.

To achieve the above object, there is provided a PDP module packing apparatus comprising a plurality of PDP module packing units, each unit including a support member and a coupling unit for coupling a PDP module to the support member, for supporting and preventing deformation of the PDP module; and a plurality of shock absorbing units for receiving and supporting a plurality of PDP module packing units, a respective shock absorbing unit being locatable at each of upper and lower ends of a plurality of the PDP module packing units and receiving one of the upper and lower ends for maintaining spacing between PDP module packing units and absorbing mechanical shock.

A packaged assembly according to the invention includes a plurality of PDP modules, each module including a PDP display circuit board and power supply; a plurality of PDP module packing units, each unit including a support member and a coupling unit coupling one of the PDP modules to a respective support member, supporting and preventing deformation of the PDP module; and a plurality of shock absorbing units receiving and supporting the plurality of PDP module packing units, a respective shock absorbing unit being located at each of upper and lower ends of the plurality of the PDP module packing units, receiving one of the upper and lower ends, and maintaining spacing between adjacent pairs of the PDP module packing units and absorbing mechanical shock.

It is preferred in the present invention that the shock absorbing unit comprises a plurality of shock absorbing members, each shock absorbing member having a plurality of insertion slots spaced from one another, each slot for receiving an upper or lower end of one of the support members.

It is preferred in the present invention that the shock absorbing unit comprises a plurality of shock absorbing members for absorbing mechanical shock, each shock absorbing member including a first cushion including a plurality of insertion slots, each slot for receiving an upper or lower end of one of the support members, the insertion slots being spaced apart so that PDP module packing units having ends inserted into the insertion slots are maintained at an interval from each other and supported by the first cushion, and a second cushion connected to the first cushion by an assembly unit.

The first cushion may contain grooves receiving protrusions of the second cushion for easy assembly of the shock absorbing units. Preferably, the first cushion has a wall higher than the deepest part of the inserting slots in the second cushion for supporting PDP modules inserted in the slots. The first cushion is most preferably harder than the second cushion.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
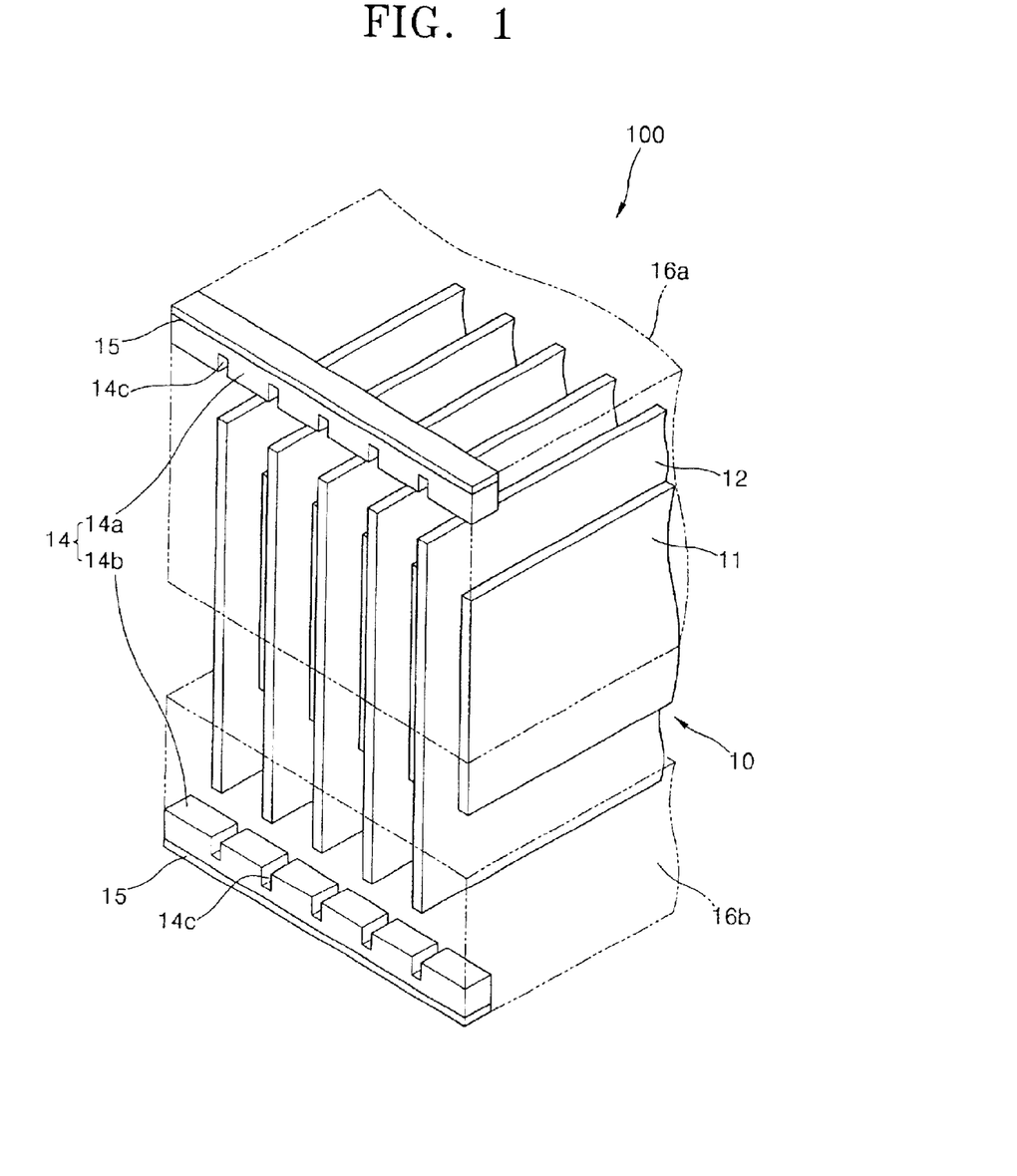
FIG. 1 is an exploded perspective view of a packing apparatus for a PDP module according to a preferred embodiment of the present invention.

In FIG. 1, a packing apparatus for a PDP module according to a preferred embodiment of the present invention, including packed PDP modules, is shown. The apparatus includes a support member 12 coupled to PDP modules 11, thus forming a PDP module packing unit. The support member 12 supports the PDP modules 11 and prevents deformation of the PDP modules 11.

A veneer board may be used as the support member 12. The veneer board must be strong enough to support a PDP module 11 and to endure humidity without warping. The support member 12 is preferably higher than a PDP module 11 so that the weight of the PDP module 11 is applied to the support member 12. The coupling of the support member 12 to the PDP module 11 will be described later with reference to FIGS. 2 and 3.

A shock absorbing unit is provided at each of upper and lower portions of the PDP module packing unit 10. The shock absorbing unit absorbs vibrations and shocks applied during shipping and supports the PDP module packing unit 10.

The shock absorbing unit includes a plurality of shock absorbing members 14. The shock absorbing members 14 include an upper shock absorbing member 14a located at the upper portion of the support member 12 and a lower shock absorbing member 14b located at the lower portion of the support member 12. Cardboard or a resilient foamed plastic, such as STYROFOAM®, may be used as the upper and lower shock absorbing members 14a and 14b.

One side of each of the upper and lower shock absorbing members 14a and 14b has insertion slots 14c spaced apart from one another. Ends of the PDP module packing units 10 are respectively inserted into the insertion slots 14c. Thus, the PDP module packing units can be maintained at an interval to avoid interference, i.e., collision, between the units. The number of the insertion slots 14c in each of the upper and lower shock absorbing members 14a and 14b preferably matches the number of the PDP module packing units 10 to be packaged.

The shock absorbing member 14 may include a reinforcement member 15. The reinforcement member 15 is installed at one side of each of the upper and lower shock absorbing members opposite the side where the insertion slots 14c are located. The reinforcement member 15 absorbs shocks together with the upper and lower shock absorbing members 14a and 14b and simultaneously improves structural strength of the upper and lower shock absorbing members 14a and 14b. The installation of the reinforcement member 15 is optional, depending on conditions of shipping. Preferably, a resilient foamed plastic or rubber is used as the reinforcement member 15.

The reinforcement member 15 is useful when cardboard is used as the upper and lower shock absorbing members 14a and 14b. Since the cardboard is manufactured by adhering several layers of paper, it may be deformed or torn apart when receiving excess shock. By installing the reinforcement member 15 at the cardboard, the structural strength of the cardboard can be improved.

The PDP module packing unit 10 including the shock absorbing unit is accommodated in a box unit. The box unit prevents intrusion of foreign material and protects the PDP modules 11. The box unit includes an outer box 16a and an inner box 16b to facilitate packing.

The bottom side of the outer box 16a is open. Preferably, the outer box 16a is as high as the height of the PDP module packing unit 10. The upper side of the inner box 16b is also open. Preferably, the inner box 16b has a height such that a worker can easily put the PDP module packing unit 10 into the inner box 16b. When the PDP module packing unit 10 is completely accommodated in the inner box 16b, the outer box 16a is put over the inner box 16b to complete the package. Accordingly, the reinforcement members 15 on the upper and lower shock absorbing members 14a and 14b contact the inner upper surface of the outer box 16a and the inner lower surface of the inner box 16b, respectively, and are supported thereby.

A dampproof member can be placed on the outside of the PDP module packing unit 10. The dampproof member wraps around the PDP module packing unit 10 to protect the PDP module packing unit 10 from humidity.

Figure 2:
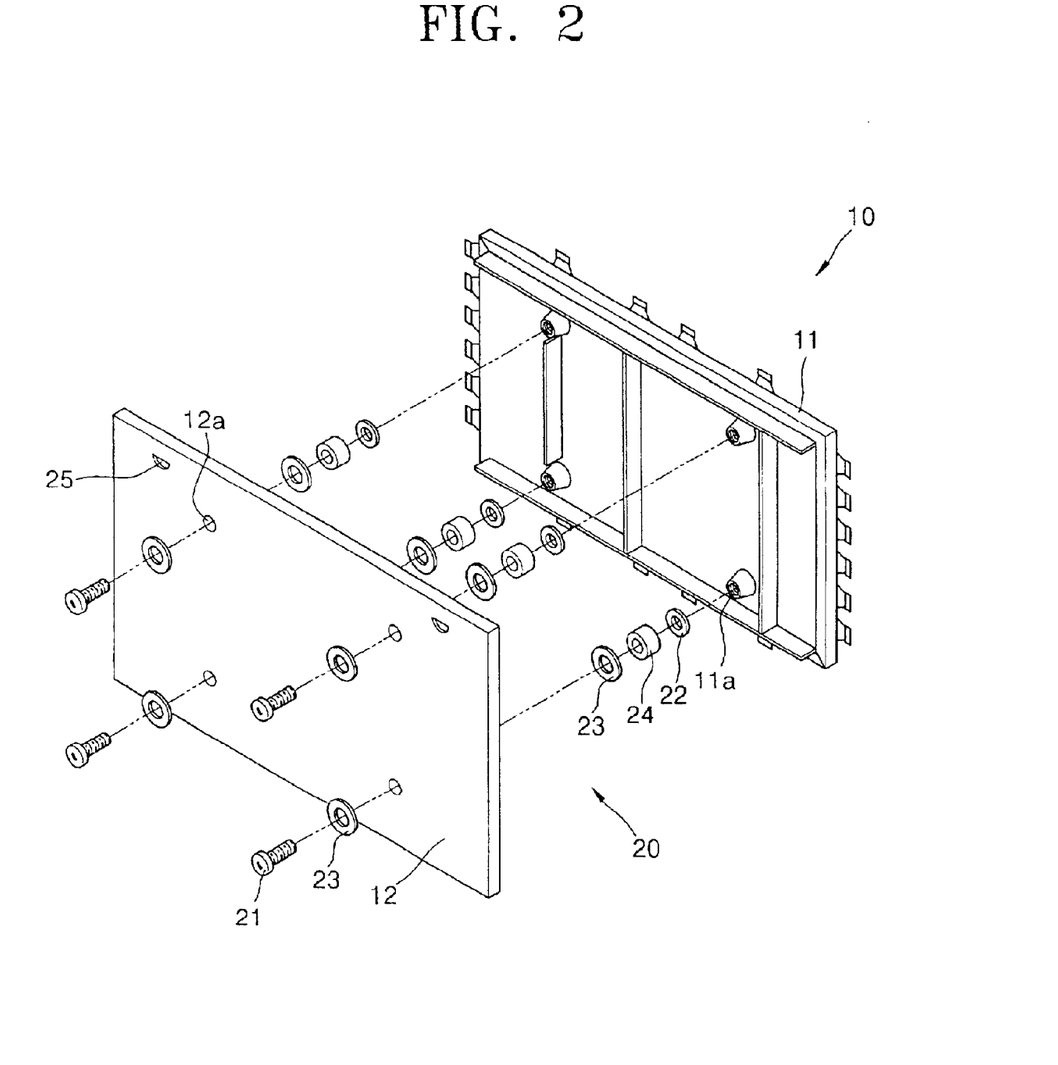
FIG. 2 is an exploded perspective view of a PDP module packing unit.
Figure 3:
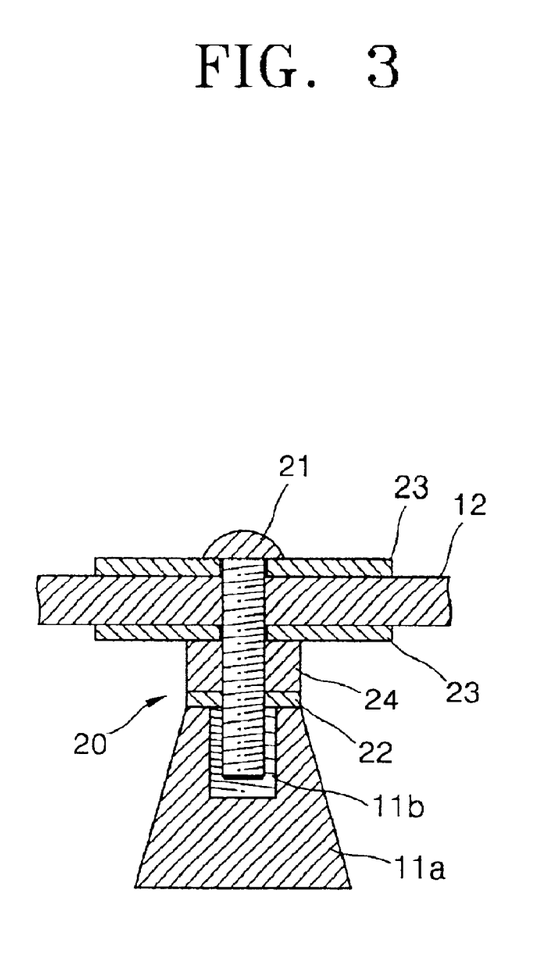
FIG. 3 is a sectional view of a portion coupled by a coupling unit of FIG. 2.

Referring to FIGS. 2 and 3, the PDP module 11 and the support member 12 are coupled by a coupling unit 20. The coupling unit 20 includes a fixing member 21 and a buffer member 22.

Typically, a plurality of bosses 11a are located on one side of the PDP module 11. The bosses 11a are used when a PDP television set is manufactured. The bosses 11a can be used when the PDP module 11 is coupled to the support member 12. In the depicted embodiment, there are four bosses. Each boss 11a includes a hole having a depth and internal threads 11b.

Four holes 12a penetrating the support member 12 match the positions of the bosses 11a. A screw is preferably used as the fixing member 21. A respective fixing member 21 threadedly engages the internal threads in each of the bosses 11a.

A buffer member 22 is installed between each of the fixing members 21 and each of the bosses 11a. One of the buffer members 22 contacts each of the bosses 11a. Thus, the buffer members 22 buffer shock so that damage to the support member 12 and the bosses 11a can be prevented. Also, when the PDP module 11 and the support member 12 are coupled, the buffer members 22 can improve coupling strength. Preferably, the buffer members 22 are rubber.

Washers 23 may be installed coaxially with the penetrating holes 12a, on opposite sides of the support member 12, that is, between the buffer member 22 and the support member 12, and between the fixing member 21 and the support member 12. Each of the washers 23 has a donut shape, that is, has a penetrating hole in the center thereof. When the fixing member 21 and each of the bosses 11a are threadedly engaged, the washers 23 distribute a force applied to the support member. When the washers 23 are installed on both sides of the support member 12, the washers 23 are preferably attached to both sides of the support member 12 in advance, by using an adhesive, to improve workability.

A spacer 24 may be installed between the fixing member 21 and each of the bosses 11a. The spacer 24 is installed to avoid interference when the support member 12 and the PDP module 11 are connected between the fixing member 21 and a relatively high power supply (not shown) of the PDP module 11. That is, when the spacer 24 is installed, the separation between the support member 12 and the PDP module 11 is increased. The spacer 24 can be omitted depending upon specific products and their design.

The buffer member 22, the washers 23, and the spacer 24 that are installed between the support member 12 and each of the bosses 11a can be integrally manufactured to improve workability.

A handle 25 including one or more grooves is located in one side of the support member 12. Since a worker can hold the PDP module packing unit 10 through the handle 25, he can easily put the PDP module packing unit 10, which is thin and has a large screen, into the inner box 16b. Alternatively, the handle 25 can have a ring-shaped member and be located at one side of the support member 12 or at the upper end of the support member 12. When the handle 25 is located at the upper end of the support member 12 and has a ring shape, a lift with a hook can be used to put the PDP module packing unit 10 into the inner box 16b.

The process of packing the PDP module 11 in a PDP module packing apparatus 100 having the above structure will be described.

First, the PDP module packing units 10 are constructed by fixing a number of the PDP modules 11 to be packaged to respective support members 12 with the coupling units 20. The lower shock absorbing member 14b is placed at both sides of and in the middle of the inner box 16b. The lower ends of the PDP module packing units 10 are inserted into the insertion slots 14c of each of the lower shock absorbing members 14b in the inner box 16b. Then, the upper shock absorbing members 14a are arranged to face both sides and the middle of upper ends of the PDP module packing units 10. The upper ends of the PDP module packing units 10 are inserted into the slots 14c in the upper shock absorbing member 14a. Then, the outer box 16a is put in place, covering the inner box 16b. The PDP module packing apparatus 100 in which the PDP module packing units 10 are packaged is placed on a support pedestal (not shown) and banded together for shipping.

FIGS. 4–7 show a packing apparatus for PDP modules and packed PDP modules according to another preferred embodiment of the present invention. Here, the same reference numerals as those in the previous drawings denote the same member having the same functions.

Figure 4:
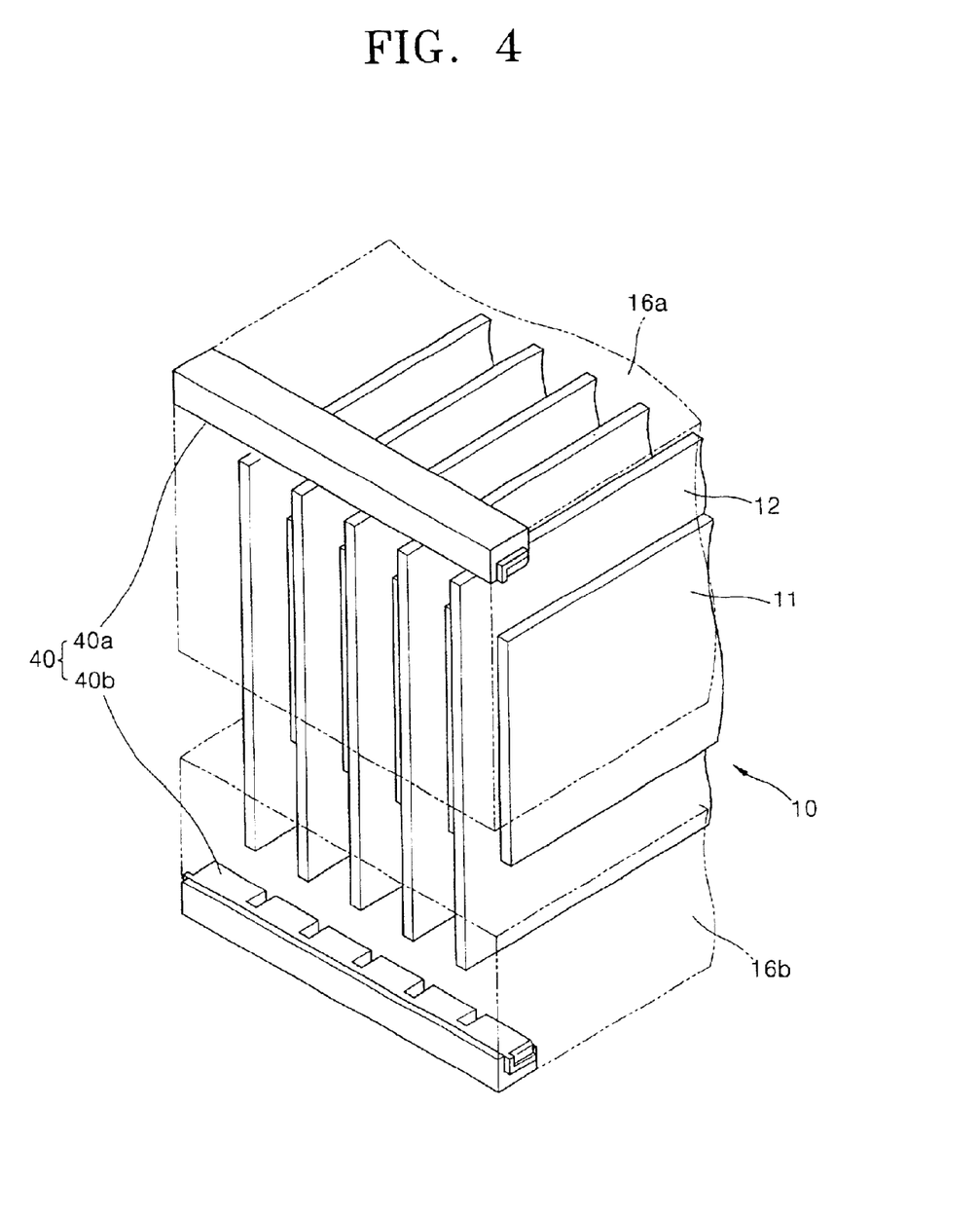
FIG. 4 is an exploded perspective view of a packing apparatus for a PDP module according to another preferred embodiment of the present invention.

As shown in the drawing, a shock absorbing unit includes a plurality of shock absorbing members 40. Each of the shock absorbing members 40 includes an upper shock absorbing member 40a and a lower shock absorbing member 40b which are preferably and respectively installed at the upper and lower ends of the support members 12 to which the PDP modules 11 are coupled. The shock absorbing member 40 is described in detail with reference to FIG. 7.

Figure 5:
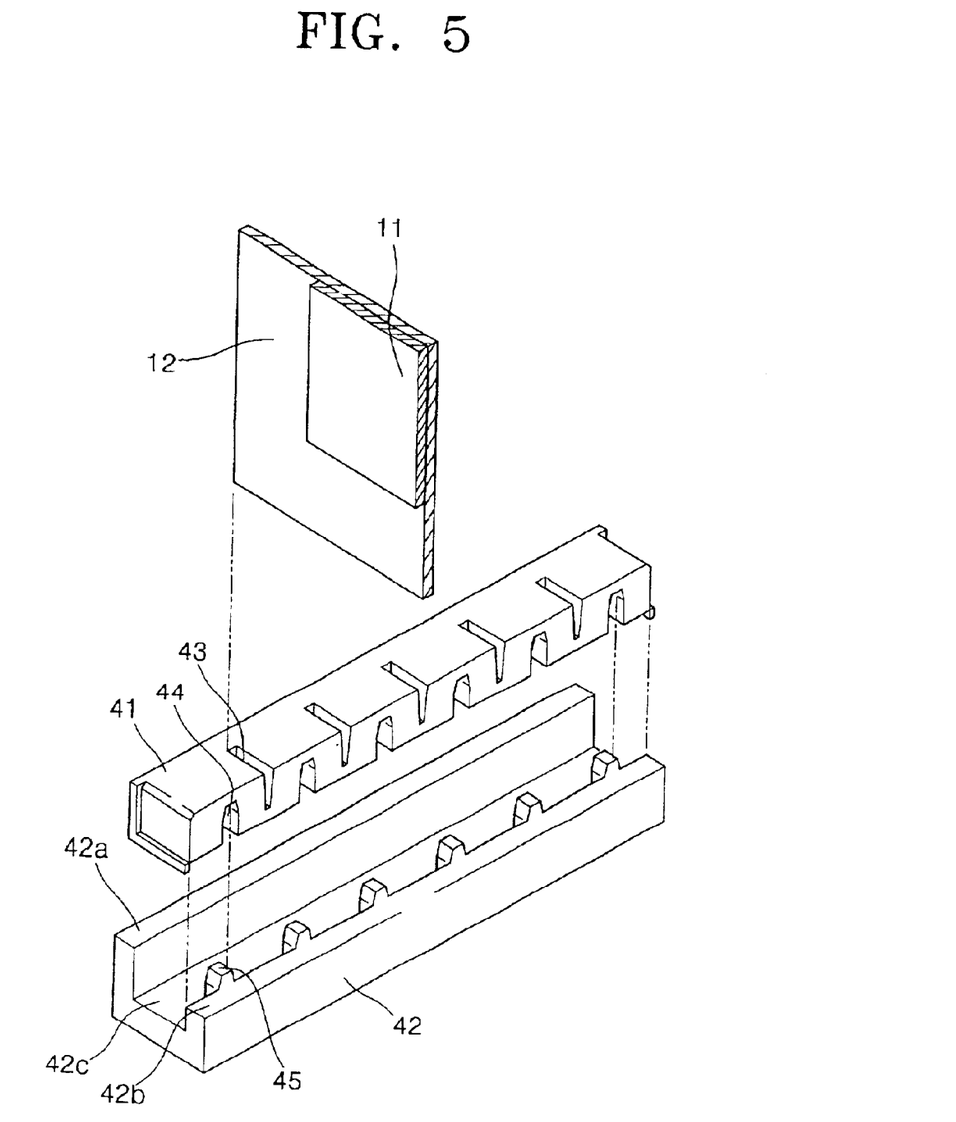
FIG. 5 is an exploded perspective view of an shock absorbing member of FIG. 4.
Figure 7:
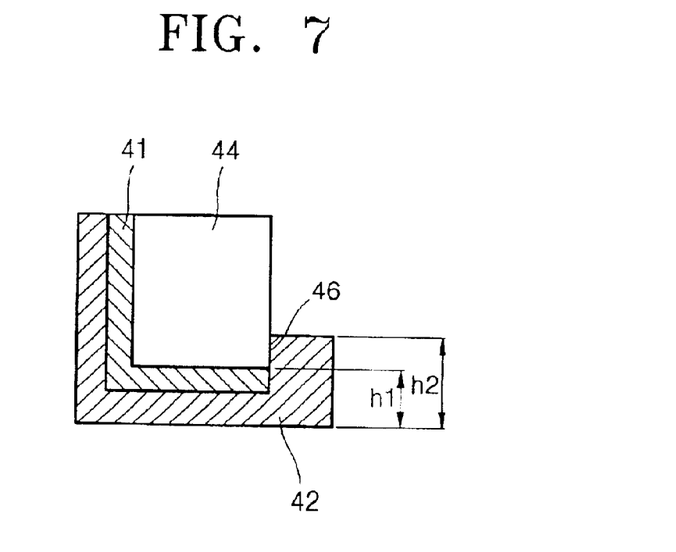
FIG. 7 is a sectional view taken along line VII—VII of FIG. 6.

The shock absorbing member 40 has a two-layer structure with first and second cushions 41 and 42. A plurality of insertion slots 43 are located at one side of the first cushion 41 and the ends of the support members 12 are inserted into the insertion slots 43. The insertion slots 43 are spaced from each other. Thus, the interval between the PDP module packing units 10 is maintained and interference between the units is avoided.

The first cushion 41 is connected to the second cushion 42 by an assembly unit. The assembly unit includes a plurality of grooves 44 in the first cushion 41 and a plurality of protrusions 45 from the second cushion 42. Alternatively, the grooves 44 and the protrusions 45 are located in the second and first cushions 42 and 41, respectively. The grooves 44 in the side surface of the first cushion 41 are spaced from one another. Preferably, the grooves 44 and the insertion slots 43 are alternately arranged. Preferably, the number of the insertion slits 43 matches the number of the PDP module packing units 10 to be packaged.

The second cushion 42 is for absorbing vibration and shock. A recess 42c receives the first cushion 41. An accommodation portion 42a defining one wall of the accommodation recess 42c supports the side surface of the first cushion 41 when the first cushion 41 is received in the recess 42c. A support 42b defining a second wall of the recess 42c supports the support members 12 inserted into each of the insertion slots 43 of the first cushion 41. Preferably, the accommodation portion 42a is sufficiently high to support the first cushion 41 when in the recess 42c. Preferably, the support 42b is shorter than the accommodation portion 42a such that the insertion slots 43 in the first cushion 41 are exposed and the ends of the support members 12 can be inserted into the insertion slots 43.

When the width of the support portion 42b of the second cushion 42 is relatively large, the ends of the support members 12 inserted into the insertion slots 43 of the first cushion 41 can be sufficiently supported. The protrusions 45 are located at the support portion 42b of the second cushion 42 corresponding to the grooves 44 of the first cushion 41. The protrusions 45 on the inner surface of the accommodation recess 42c, along the lengthwise direction, preferably extend above the upper surface of the support portion 42b. The protrusions 45 are high and the grooves 44 corresponding to the protrusions 45 are deep. When the protrusions 45 are being inserted in the grooves 44, contact area between the protrusions 45 and the grooves 44 increases so that the mounting of the cushions can be stably maintained.

Preferably, the first cushion 41 is a resilient foamed plastic, relatively harder than the second cushion 42. Since ends of the support members 12 are fixedly inserted in the first cushion 41, the first cushion 41 is preferably a hard material for supporting the support member 12 upright. Also, since the upper surface of the support portion 42b of the second cushion 42 supports the support member 12 by contacting the lower surface of the support member 12, the second cushion 42 is preferably a resilient foamed plastic, softer than the first cushion, to protect the PDP module packing units 10 from outside vibration and shock.

Figure 6:
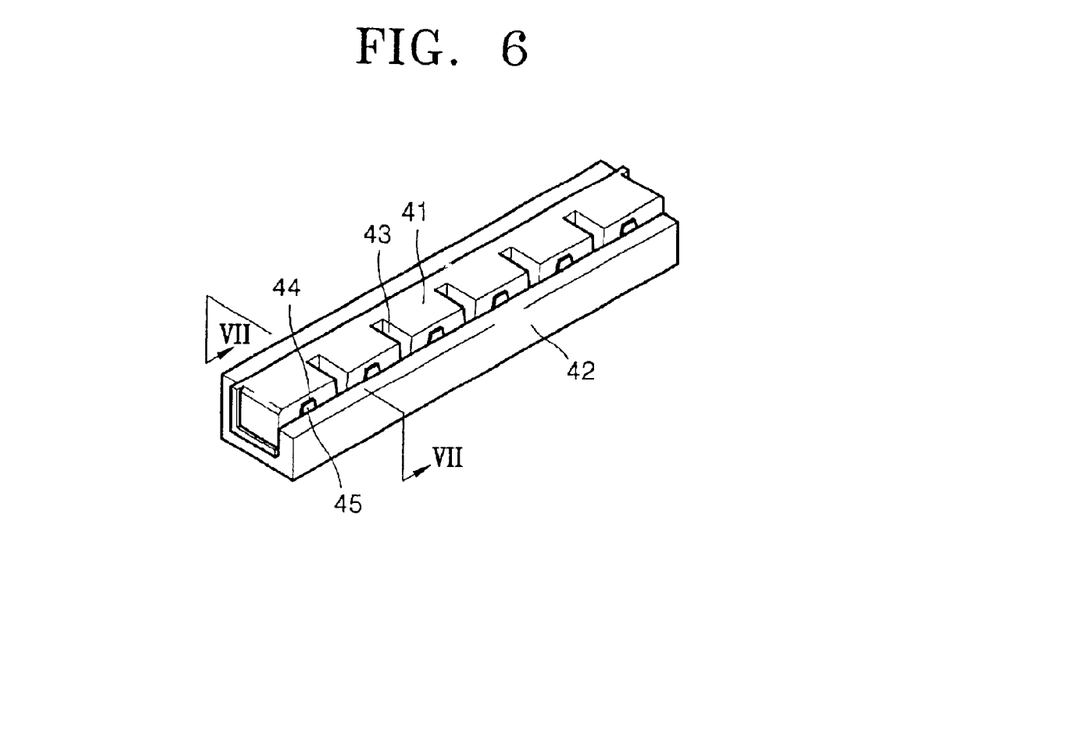
FIG. 6 is a perspective view showing an assembled state of the shock absorbing member of FIG. 4.

In addition, when the first and second cushions 41 and 42 are assembled as shown in FIG. 6, the height h1 from the lower surface of the second cushion 42 to the lower surface of the insertion slot 43 is preferably less than the height h2 of the support portion 42b, that is, the height from the lower surface of the second cushion 42 to the upper surface of the support portion 42b. Consequently, as shown in FIG. 7, the lower surface of the insertion slot 43 of the first cushion 41 is lower than the upper surface of the support 42b of the second cushion 42, forming a step 46. Thus, when vibration and shock are applied to the support member 12, the vibration and shock can be effectively absorbed by the step 46.

As described above, in the PDP module packing apparatus according to the present invention, a PDP module is coupled to a support member and PDP modules coupled to support members are accommodated in the boxes together with the shock absorbing unit. Thus, the PDP modules can be safely shipped to a destination without receiving external vibration and shock.

Since the shock absorbing member is a two layer structure in which the first and second cushions have different rigidities, packing work can be safely and easily performed. When the shock absorbing member is once used, no permanent deformation occurs so that the shock absorbing member can be reused.

The technical concept of the present invention is not limited to a PDP module, and can be applied to packaging of any thin flat display device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A plasma display panel (PDP) module packing apparatus comprising:

a plurality of PDP module packing units, each unit including a support member and a coupling unit for coupling a PDP module to the support member, for supporting and preventing deformation of the PDP module; and a plurality of shock absorbing units for receiving and supporting a plurality of PDP module packing units, a respective shock absorbing unit being locatable at each of upper and lower ends of a plurality of the PDP module packing units and receiving one of the upper and lower ends for maintaining spacing between PDP module packing units and absorbing mechanical shock, each shock absorbing unit comprising a plurality of shock absorbing members for absorbing mechanical shock, each shock absorbing member including a first cushion including a plurality of insertion slots, each insertion slot for receiving an upper or lower end of one of the support members, the insertion slots being spaced apart so that PDP module packing units having ends inserted into the insertion slots are maintained at an interval from each other and are supported by the first cushion, a second cushion, and assembly units connecting the second cushion to the first cushion and comprising a plurality of grooves in one side of the first cushion and spaced from one another and a plurality of protrusions at one side of the second cushion, insertable into corresponding grooves of the first cushion.

2. The packing apparatus as claimed in claim 1, wherein the second cushion includes a recess for accommodating the first cushion, an accommodation portion defining a first wall of the recess and supporting the first cushion, and a support wall defining a second wall of the recess and for supporting the first cushion, wherein the protrusions are located at opposite sides of the insertion slots, and the first wall is higher than the second wall.

3. The packing apparatus as claimed in claim 2, wherein, when the first and second cushions are assembled, a height from a lower surface of the second cushion to a lower surface of the insertion slot is less than a height of the second wall from the lower surface of the second cushion.

4. The packing apparatus as claimed in claim 1, wherein the support members are higher than the PDP modules when the support member is received by the shock absorbing units so that weight of a PDP module coupled to a support member is transmitted to the support member.

5. A plasma display panel (PDP) module packing apparatus comprising:

a plurality of PDP module packing units, each unit including a support member and a coupling unit for coupling a PDP module to the support member, for supporting and preventing deformation of the PDP module; and a plurality of shock absorbing units for receiving and supporting a plurality of PDP module packing units, a respective shock absorbing unit being locatable at each of upper and lower ends of a plurality of the PDP module packing units and receiving one of the upper and lower ends for maintaining spacing between PDP module packing units and absorbing mechanical shock, each shock absorbing unit comprising a plurality of shock absorbing members for absorbing mechanical shock, each shock absorbing member including a first cushion including a plurality of insertion slots, each insertion slot for receiving an upper or lower end of one of the support members, the insertion slots being spaced apart so that PDP module packing units having ends inserted into the insertion slots are maintained at an interval from each other and are supported by the first cushion, and a second cushion connected to the first cushion, the first cushion being harder than the second cushion.

6. A packaged plasma display panel (PDP) module assembly comprising:

a plurality of PDP modules, each module including a PDP panel and chassis;

a plurality of PDP module packing units, each packing unit including a support member and a coupling unit coupling one of the PDP modules to a respective support member, supporting and preventing deformation of the PDP module; and a plurality of shock absorbing units receiving and supporting the plurality of PDP module packing units, a respective shock absorbing unit being located at each of upper and lower ends of the plurality of the PDP module packing units, receiving one of the upper and lower ends, and maintaining spacing between adjacent pairs of the PDP module packing units and absorbing mechanical shock, each shock absorbing unit comprising a plurality of shock absorbing members for absorbing mechanical shock, each shock absorbing member including a first cushion including a plurality of insertion slots, each insertion slot receiving an upper or lower end of one of the support members, the insertion slots being spaced apart so that adjacent pairs of the PDP module packing units having ends inserted into the insertion slots are maintained at an interval from each other and are supported by the first cushion, a second cushion, and assembly units connecting the second cushion to the first cushion and comprising a plurality of grooves in one side of the first cushion and spaced from one another and a plurality of protrusions at one side of the second cushion and insertable into corresponding grooves of the first cushion.

7. The packaged assembly as claimed in claim 6, wherein the second cushion includes a recess accommodating the first cushion, an accommodation portion defining a first wall of the recess and supporting the first cushion, and a support wall defining a second wall of the recess and supporting the first cushion, wherein the protrusions are located at opposite sides of the insertion slots, and the first wall is higher than the second wall.

8. The packaged assembly as claimed in claim 7, wherein a height from a lower surface of the second cushion to a lower surface of the insertion slot is less than a height of the second wall from the lower surface of the second cushion.

9. The packaged assembly as claimed in claim 6, wherein the support members are higher than the PDP modules so that weight of each PDP module coupled to a support member is transmitted to the support member.

10. A packaged plasma display panel (PDP) module assembly comprising:

a plurality of PDP modules, each module including a PDP panel and chassis;

a plurality of PDP module packing units, each unit including a support member and a coupling unit coupling one of the PDP modules to a respective support member, supporting and preventing deformation of the PDP module; and a plurality of shock absorbing units receiving and supporting the plurality of PDP module packing units, a respective shock absorbing unit being located at each of upper and lower ends of the plurality of the PDP module packing units, receiving one of the upper and lower ends, and maintaining spacing between adjacent pairs of the PDP module packing units and absorbing mechanical shock, each shock absorbing unit comprising a plurality of shock absorbing members for absorbing mechanical shock, each shock absorbing member including a first cushion including a plurality of insertion slots, each insertion slot receiving an upper or lower end of one of the support members, the insertion slots being spaced apart so that adjacent pairs of the PDP module packing units having ends inserted into the insertion slots are maintained at an interval from each other and are supported by the first cushion, and a second cushion connected to the first cushion, the first cushion being harder than the second cushion.

* * * * *